United States Patent [19]
Sittig et al.

[11] Patent Number: 5,977,611
[45] Date of Patent: Nov. 2, 1999

[54] POWER DIODE AND HYBRID DIODE, VOLTAGE LIMITER AND FREEWHEELING DIODE HAVING THE POWER DIODE

[75] Inventors: Roland Sittig, Braunschweig; Karim-Thomas Taghizadeh-Kaschani, Unterhaching, both of Germany

[73] Assignee: Siemens Aktiengesellschaft, Munich, Germany

[21] Appl. No.: 09/055,795

[22] Filed: Apr. 6, 1998

[30] Foreign Application Priority Data

Apr. 4, 1997 [DE] Germany .................. 197 13 962

[51] Int. Cl.$^6$ ............ H01L 31/075; H01L 31/105; H01L 31/117
[52] U.S. Cl. ............ 257/603; 257/604; 257/656; 257/657
[58] Field of Search .................. 257/603, 604, 257/656, 657

[56] References Cited

U.S. PATENT DOCUMENTS

| | | | |
|---|---|---|---|
| 3,270,293 | 8/1966 | Loach, Jr. et al. .............. 331/107 |
| 3,890,630 | 6/1975 | Huang ............................ 357/13 |
| 3,916,427 | 10/1975 | Ying et al. ..................... 357/13 |
| 3,921,192 | 11/1975 | Goronkin et al. ............... 357/13 |
| 4,131,339 | 12/1978 | Dannhäuser et al. ............ 357/13 |
| 4,200,877 | 4/1980 | Suzuki et al. .................. 357/13 |
| 4,476,481 | 10/1984 | Iesaka et al. ................... 357/58 |
| 4,857,972 | 8/1989 | Jorke et al. ...................... 357/4 |
| 5,119,148 | 6/1992 | Anderson et al. ................ 357/14 |
| 5,717,244 | 2/1998 | Soejima ......................... 257/617 |
| 5,811,873 | 9/1998 | Soejima ......................... 257/655 |

FOREIGN PATENT DOCUMENTS

| | | |
|---|---|---|
| 356103460 | 8/1981 | Japan . |
| 406140642 | 5/1994 | Japan . |
| 410284738 | 10/1998 | Japan . |

OTHER PUBLICATIONS

"How to avoid TRAPATT Oscillations at the Reverse–Recovery of Power Diodes", K.T. Kaschan et al., Institut Für Elektrophysik, Technishe Universutät Braunschweig, Germany, pp. 571–571.

*Primary Examiner*—William Mintel
*Attorney, Agent, or Firm*—Herbert L. Lerner; Laurence A. Greenberg

[57] ABSTRACT

A Read diode includes an inner zone, a cathode zone, an anode zone and a first coupling zone disposed between the inner zone and the anode zone. A second coupling zone is disposed between the first coupling zone and the inner zone. Both coupling zones are used in the reverse mode for dividing an electric field into a high-field zone and a low-field zone and, consequently, permit greatly localized charge carrier generation by impact ionization in the voltage breakdown. The use of the two coupling zones ensures "punch-through" coupling between the high-field and low-field zones which, in contrast to the space charge coupling of Read diodes, permits a largely temperature-independent "soft-recovery" behavior. Hybrid diodes having optimized forward and commutation behaviors can be produced from the FCI-PT diodes. FCI-PT diodes are preferably employed in conjunction with switching power semiconductor components as voltage limiters or freewheeling diodes.

7 Claims, 2 Drawing Sheets

PRIOR ART

POWER DIODE AND HYBRID DIODE, VOLTAGE LIMITER AND FREEWHEELING DIODE HAVING THE POWER DIODE

BACKGROUND OF THE INVENTION

Field of the Invention

The invention relates to a power diode including a semiconductor body having an inner zone of a first conduction type, a cathode zone of the first conduction type adjoining the inner zone and having a higher doping concentration than the inner zone, at least one first coupling zone of the first conduction type adjoining the inner zone and having a doping concentration higher than that of the inner zone and lower than that of the cathode zone, and an anode zone of the second conduction type adjoining the first coupling zone and having a higher doping concentration than in the first coupling zone.

An FCI (Field-Controlled-Injection) diode of the type mentioned in the introduction is known, for example, as a Read diode and is described by K. T. Kaschani and R. Sittig in a paper entitled "How to avoid TRAPATT-Oscillations at the Reverse Recovery of Power Diodes", in CAS '95, pp. 571–574, Sinaia, 1995. The subject matter of that document is hereby expressly incorporated by reference in the present application.

The Read diode was originally developed as a high-frequency component for generating IMPATT oscillations. The FCI concept is explained below in conjunction with FIG. 1 with reference to the known Read diode in a specific construction as a pin power diode. In such a pin power diode, the electric fields of a high-field zone and a low-field zone are through a space charge of a coupling zone. However, space charge coupling has proved to be difficult to manipulate for the commutation of power diodes, since the space charge coupling is extremely temperature-dependent. Accordingly, it is difficult to use such pin power diodes in practice.

SUMMARY OF THE INVENTION

It is accordingly an object of the invention to provide a power diode and a hybrid diode, a voltage limiter and a freewheeling diode having the power diode, which overcome the hereinafore-mentioned disadvantages of the heretofore-known devices of this general type and which provide new FCI diodes in which coupling of an electric field of a high-field zone to a low-field zone leads to a virtually temperature-independent breakdown voltage.

With the foregoing and other objects in view there is provided, in accordance with the invention, a power diode, comprising a semiconductor body having an inner zone of a first conduction type; a cathode zone of the first conduction type adjoining the inner zone and having a higher doping concentration than the inner zone; at least one first coupling zone of the first conduction type having a doping concentration higher than the inner zone and lower than the cathode zone; an anode zone of a second conduction type adjoining the first coupling zone and having a higher doping concentration than in the first coupling zone; and at least one second coupling zone of the second conduction type disposed between the first coupling zone and the inner zone, the at least one second coupling zone having a doping concentration higher than the inner zone and lower than the anode zone.

Such power diodes are referred to as FCI diodes with "punch-through" coupling (FCI-PT diodes). Punch-through coupling is understood to mean that in the reverse mode, the electric field in the high-field zone and in the low-field zone are coupled by the known punch-through effect due to the interactions of the two coupling zones.

In contrast to power diodes of the type mentioned in the introduction, FCI-PT diodes have active, controlled overvoltage limiting which is largely independent of stored charge, commutation gradient and lifetime setting, which leads to no appreciable influencing of the forward properties, of the reverse properties and of the turn-on behavior and, in addition, permits a distinct reduction of the switching losses. Moreover, in contrast to power diodes with space charge coupling, the FCI-PT diodes presented according to the invention have a temperature-independent breakdown voltage, with the result that the commutation process proceeds largely independently of temperature.

In accordance with another feature of the invention, there is provided at least one monolithically integrated diode connected in series and reverse-connected in parallel with the power diode.

A further zone for producing a pn junction can advantageously be provided on the anode or on the cathode side. This zone typically has a higher doping concentration than the anode zone or cathode zone adjoining it. In this way, it is possible to produce a series circuit formed by an FCI-PT diode and a further diode connected in the reverse direction with respect thereto. This monolithically integrated, reverse-connected parallel diode series circuit enables the forward mode of the FCI-PT diode to be suppressed, with the result that it then functions purely as a voltage limiter.

In accordance with a further feature of the invention, there is provided a further diode connecting in parallel, which advantageously enables an FCI hybrid diode configuration to be obtained therefrom, in which only the further diode is relevant in the forward mode and only the FCI-PT diode is relevant in the reverse mode. If the further diode is a component having optimized forward behavior, then in this way it is possible to simultaneously achieve a minimization of the forward losses and of the switching losses and also an optimization of the commutation profile.

In accordance with an added feature of the invention, geometrically coupled power diodes are used in a very advantageous manner as voltage limiters for suppressing transient overvoltages. Currently available transient voltage limiters (transient voltage suppressors, TVS) are limited to voltages $\leq 500$ V. Other comparable components, such as varistors, for example, do not respond fast enough, do not endure the losses associated with frequent transient recovery voltage spikes or age more rapidly than desired. The diodes according to the invention furthermore enable voltage limiters to also be provided for voltages greater than 500 V.

In accordance with an additional feature of the invention, the FCI diodes are constructed as simple Read diodes. This is possible when the doping concentration of the cathode zone is chosen to be very high. In this way, it is possible to virtually compensate for the temperature dependence of the breakdown voltage. In this case, the cathode zone typically has a doping concentration of about $10^{17} cm^{-3}$. However, this presupposes a distinctly more highly doped anode zone.

In accordance with yet another feature of the invention, the FCI-PT diode is used particularly advantageously as a freewheeling diode for power semiconductor components, such as, for example, in a parallel circuit with bipolar transistors, MOSFETs, IGBTs, GTOs, thyristors, or MCTs, etc.

In accordance with a concomitant feature of the invention, there is provided a power semiconductor component in a parallel circuit with the power diode.

The critical operating state of a power diode of the type mentioned in the introduction is commutation, that is to say the changeover from the forward mode to the reverse mode. During commutation, the stored charge required in the forward mode for conductivity modulation of the inner zone must be removed again in a very short time in order to subsequently be able to take up reverse voltage again. This is carried out through the so-called reverse current, which is automatically established during the changeover to the reverse mode.

However, due to the influence of unavoidable leakage inductances, in practice a power diode can only be commutated with a finite gradient. In order to avoid high inductive overvoltages as well as oscillations, a power diode should have the softest possible commutation behavior, which is called "soft-recovery" behavior. This is understood to mean in particular a reverse current which decays softly after reaching the reverse current peak.

The commutation behavior of a power diode after reaching the reverse current peak is defined as the need to again completely discharge the leakage inductance that has been charged to the maximum reverse current. In order to minimize the losses occurring in the diode in the process, that discharge operation is intended to proceed as quickly as possible. At the same time, however, a soft recovery behavior is also sought. That results in limiting the inductive overvoltages which occur and avoiding any oscillations, since they can lead to impairment right through to destruction of neighboring components or of the power diode itself.

However, limiting the overvoltage necessarily results in a slower discharge of the leakage inductance and thus an increase in the switching losses, so that the question of a compromise is posed, in principle, in connection with the minimization of overvoltages and switching losses. However, it is possible to optimize the switching losses in the context of this compromise, with a predetermined maximum overvoltage, by varying the current and/or voltage profile.

The measures for ensuring the soft recovery behavior which are sought can be differentiated into internal and external measures, depending on the starting point.

The external measures relate to corresponding modifications of the surrounding network of the power diode or the driving thereof. This includes, for example, the wiring up of the power diode with a so-called "snubber", that is to say a series circuit including a resistor and a capacitor. This is intended to damp the commutation behavior. However, a snubber always leads to increased switching losses, a larger volume and weight of the relevant device and ultimately to higher costs.

A different route currently being taken for relieving the load on power diodes and ensuring a soft recovery behavior resides in reducing the switching speeds of the semiconductor switches involved and thus damping the commutation behavior. That would correspond to initiating the commutation process by a controllable resistor instead of an ideal switch. Although that succeeds in avoiding the occurrence of any overvoltage and in noticeably relieving the load on the respective power diodes, at the same time the switching losses of the semiconductor switches involved increase greatly.

The internal measures are essentially corresponding interventions in the construction of power diodes. Those interventions essentially relate to optimizing the doping profile or the lifetime setting.

The commutation behavior of a power diode in the case of the external measures described is critically determined by other components. As a rule, that always leads to increased switching losses. In addition, under those circumstances the power diode can only be optimized to a limited extent. Due to that reason, the present invention concentrates exclusively on optimizing the diode structure.

Usually, an attempt is made to achieve a soft commutation behavior by extending the inner zone and providing an additional charge carrier reservoir which is already applied in the forward mode. However, that leads to the corresponding diodes having inner zone widths which are overdimensioned as measured by the permissible reverse voltage. The forward voltages and the switching losses are increased as a result of that overdimensioning.

Furthermore, that procedure does not ensure that the charge carrier reservoir applied in the forward mode actually satisfies the requirements of the commutation process. If, on one hand, the charge carrier reservoir is too small, then chopping of the reverse current occurs and thus, due to the influence of the leakage inductances, increased overvoltages and undesirable oscillations caused by the inductance occur. If, on the other hand, the charge carrier reservoir is too large, then reverse currents occur which decay correspondingly slowly, the so-called "tail currents", and therefore increased switching losses occur.

An alternative thereto is to limit inductive overvoltages during the commutation process by targeted generation of charge carriers and thus by controlled discharge of the leakage inductance, as soon as a specific reverse voltage is exceeded. This concept is called "field-controlled injection" or FCI for short. The mechanism that serves to generate the required charge carriers is impact ionization, which in any case upwardly limits the blocking ability of a power diode.

Charge carriers are generated as required by the FCI concept, so that a soft recovery behavior automatically results. A prerequisite, however, is greatly localized charge carrier generation since TRAPATT oscillations can otherwise occur.

The fundamental advantage of the FCI concept is that overdimensioning of the inner zone is not necessary. This enables forward losses and switching losses to be distinctly reduced as compared with power diodes of the type mentioned in the introduction.

Thus, the present invention develops FCI diodes by punch-through coupling. As a result of this punch-through coupling, their breakdown behavior and thus their soft recovery behavior as well become largely independent of temperature.

Other features which are considered as characteristic for the invention are set forth in the appended claims.

Although the invention is illustrated and described herein as embodied in a power diode and a hybrid diode, a voltage limiter and a freewheeling diode having the power diode, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
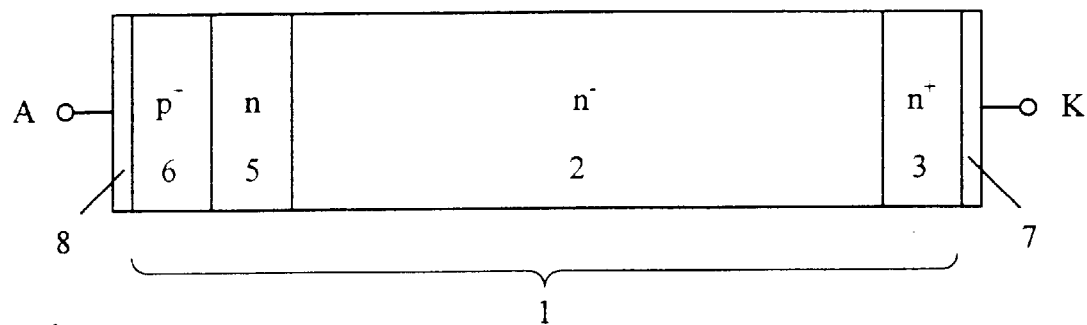
FIG. 1 is a diagrammatic, cross-sectional view of a semiconductor body of a pin power diode with space charge coupling (Read diode) according to the prior art.

Referring now to the figures of the drawings in detail and first, particularly, to FIG. 1 thereof, there is seen a Read diode which was originally developed as a high-frequency component for generating IMPATT oscillations. The FCI concept is explained below in conjunction with FIG. 1 with reference to a known Read diode in a specific construction as a pin power diode. A Read diode of that type is disclosed particularly in FIG. 5 of the above-mentioned document by Kaschani et al.

The pin power diode according to FIG. 1 includes a semiconductor body 1. The semiconductor body 1 includes an n$^-$-doped inner zone 2. An n$^+$-doped cathode zone 3 is disposed at the inner zone 2 on the cathode side. The cathode zone 3 is connected through a cathode electrode 7 to a cathode terminal K. An n-doped coupling zone 5 as well as a p$^+$-doped anode zone 6 adjoin the inner zone 2 on the anode side. On the anode side, the anode zone 6 is connected through an anode electrode 8 to an anode terminal A.

As is shown in FIG. 1, the narrow coupling zone 5 is introduced in the pin diode between the anode zone 6 and the inner zone 2. The coupling zone 5 has the same conduction type as the inner zone 2 but is doped more heavily than the inner zone 2. Due to that doping profile, the electric field in the reverse mode is composed of a so-called high-field zone and a so-called low-field zone. In that case, high-field zone refers to regions having a high electric field strength, and low-field zone refers to regions having a low electric field. Whereas the high-field zone in that case is restricted to the narrow region of the coupling zone 5 directly before the anode zone 6, the low-field zone extends virtually homogeneously through the entire inner zone 2. However, the resulting breakdown field strength is also distinctly higher in the high-field zone than in the low-field zone ($E_{BD,H} \gg E_{BD,L}$) according to the doping level.

In order to ensure localized avalanche multiplication in the event of a voltage breakdown, the pin diode is dimensioned in such a way that the field peak in the high-field zone reaches its breakdown field strength $E_{BD,H}$ precisely at that point in time, whereas the field maximum in the low-field zone is still far below its breakdown field strength $E_{BD,L}$. Therefore, if the breakdown voltage $V_{BD}$ is exceeded, then initially charge carrier generation due to avalanche multiplication occurs only in the high-field zone.

While the holes generated in that way flow immediately to the adjoining p$^+$-doped anode zone 6, the electrons have to traverse the entire space charge zone on their way to the n$^+$-doped cathode zone 3. In that case, the electrons move at saturated velocity in the high-field zone and lead, due to their negative charge, to corresponding compensation of the space charges of high-field zone and low-field zone.

However, the effect of that compensation on the two zones varies. Thus, in the high-field zone there is a reduction in the field peak and a reduction in the avalanche multiplication, which in turn leads to a decrease in the electron current or its compensating effect on the space charge there. Finally, that negative feedback results in stabilization of the field maximum near the breakdown field strength $E_{BD,H}$, irrespective of the overvoltage that is present.

On one hand, the high-field zone therefore serves both to provide the necessary charge carriers and to localize the avalanche multiplication as required. On the other hand, in the low-field zone, the increasing compensation of the space charge by the electron current, which grows as the overvoltage rises, leads to an increase in the gradient on the electric field and thus to a corresponding increase in the electric field, in particular before the cathode zone 3.

In the pin power diode according to FIG. 1, the electric fields of the high-field zone and the low-field zone are coupled through the space charge of the coupling zone 5. However, space charge coupling has proved to be difficult to manipulate for the commutation of power diodes, since the space charge coupling is extremely temperature-dependent. Accordingly, use of such pin power diodes in practice is difficult.

Figure 2:
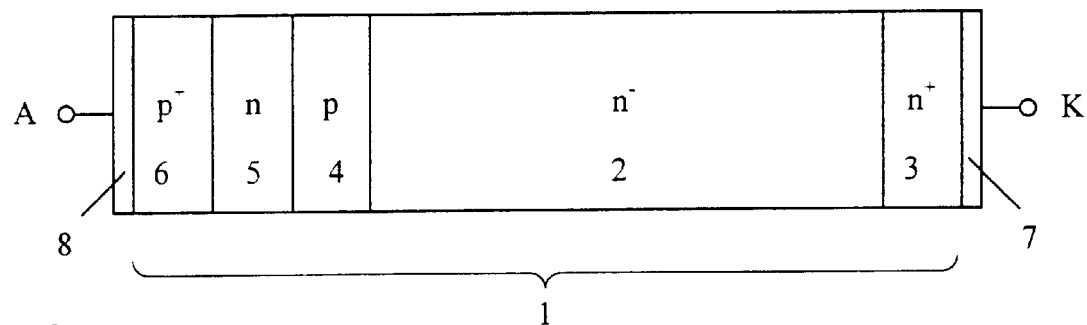
FIG. 2 is a cross-sectional view of a semiconductor body of an FCI diode with punch-through coupling according to the invention.

FIG. 2 shows a cross section through the semiconductor body of an FCI diode with punch-through coupling according to the invention. Identical elements corresponding to FIG. 1 are provided with the same reference symbols.

The power diode according to FIG. 2 essentially contains the elements of the Read diode from FIG. 1: an n$^-$-doped inner zone 2, an n$^+$-doped cathode zone 3, an n-doped first coupling zone 5 and a p$^+$-doped anode zone 6. On the anode side and on the cathode side, the FCI diode is respectively connected to an anode terminal A and to a cathode terminal K. However, in contrast to FIG. 1, a p-doped second coupling zone 4 is additionally disposed between the inner zone 2 and the first coupling zone 5 in FIG. 2.

Power diodes which are configured in this way are referred to below as FCI diodes with punch-through coupling (FCI-PT coupling).

The functioning of the second coupling zone 4 according to the invention in FCI diodes of the type mentioned in the introduction is explained below.

In the reverse mode, the high-field zone is spatially separated from the low-field zone due to the introduction of an additional pn junction by the second coupling zone 4. On one hand, the high-field zone in this case is formed by the heavily doped pn junction between the anode zone 6 and the first coupling zone 5. On the other hand, the low-field zone extends from the second coupling zone 4 through the inner zone 2 up to the cathode zone 3. The coupling of the high-field zone and the low-field zone is produced in this case by a "punch-through" of the additionally introduced second coupling zone 4 on the part of the low-field zone.

Therefore, in the case of an FCI-PT diode, it is of great importance that when the breakdown voltage that is sought is reached, the neutral width of the second coupling zone is not large as compared with the diffusion length of the minority charge carriers there. Otherwise, what occurs would not be a punch-through coupling but rather a current coupling during which the reverse voltage is distributed through the high-field zone and the low-field zone, according to the reverse current, and during which a defined voltage breakdown with localized avalanche multiplication is no longer possible.

Figure 3:
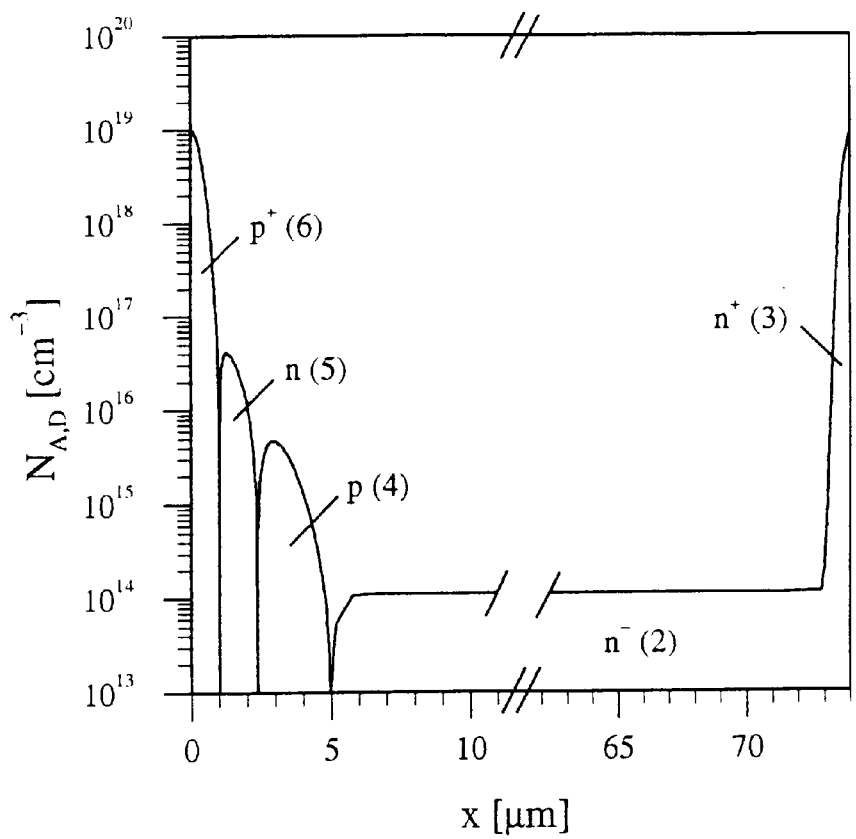
FIG. 3 is a graph showing an example of a doping profile of an FCI diode with punch-through coupling according to FIG. 2.

FIG. 3 shows a possible doping profile of an FCI-PT diode according to FIG. 2. In the present example, the p$^+$-doped anode zone has a width of 1 $\mu$m and has a maximum doping concentration of $10^{19}$ cm$^{-3}$. The adjoining n-doped first coupling zone 5 has a width of about 1.4 μm and has a maximum doping concentration of $4 \times 10^{16}$ cm$^{-3}$. The p-doped second coupling zone 4 has a width of about 2.6 μm and has a maximum doping concentration of about $5 \times 10^{15}$ cm$^{-3}$. On the cathode side, the n$^+$-doped cathode zone 3 has a width of about 1 μm and has a maximum doping concentration of $10^{19}$ cm$^{-3}$. In the present example, the n$^-$-doped inner zone 2 of the semiconductor body 1 has a doping concentration of about $10^{14}$ cm$^{-3}$ and has a width of about 68 μm.

Figure 4:
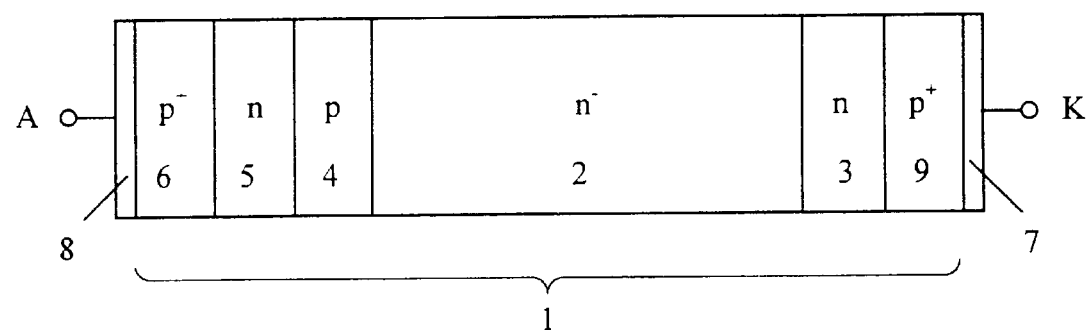
FIG. 4 is a cross-sectional view of a semiconductor body of an FCI diode with punch-through coupling and a blocking diode integrated in the cathode side.

FIG. 4 shows an FCI-PT diode developed according to FIG. 2. Identical elements corresponding to the previous figures are provided with the same reference symbols.

The FCI-PT diode according to FIG. 2 has been developed in FIG. 4 in such a way that, on the cathode side, a further p$^+$-doped zone 9 is provided between cathode terminal K and cathode zone 3. An additional pn junction is produced by adding the additional zone 9 into the semiconductor body of FIG. 2. In this way, it is possible to produce a monolithically integrated semiconductor component including two reverse-connected parallel diodes connected in series.

In principle, when producing an additional pn junction by inserting an additional zone 9 into the FCI diode according to FIG. 2, it must be ensured that the diode of the newly produced pn junction concerned is connected in series and reverse-connected in parallel with the FCI diode. Furthermore, it must be ensured that the breakdown voltage of the additional pn junction is dimensioned sufficiently high to prevent a flow of current in the forward direction. For this reason, the cathode zone 3 is more weakly doped than the further zone 9 in the present example. Finally, it must be ensured that the cathode zone 3 adjoining the further zone 9 is dimensioned wide enough to ensure that "punch-through" of the further zone 9 does not occur. In this case, the blocking action of the additional pn junction would be annulled or taken out of force.

It is, of course, also conceivable to place the additional zone 9 on the anode side between the anode zone 6 and the anode electrode 8. In this case, the anode-side additional zone would have to be n$^+$-doped and the anode zone 6 would have to be dimensioned sufficiently wide.

An additional pn junction for realizing two reverse-connected parallel diodes can, of course, also be produced by an anode-side or cathode-side Schottky contact instead of a further zone 9.

Figure 5:
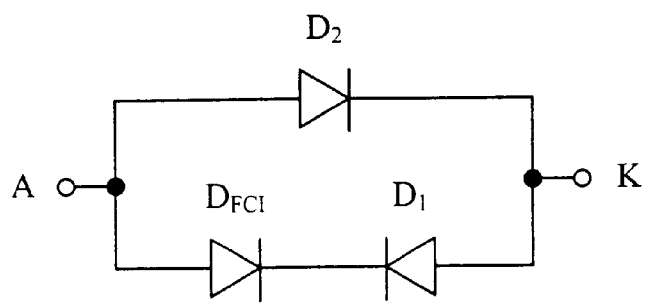
FIG. 5 is a schematic circuit diagram of an FCI hybrid diode as a preferred application of an FCI diode with punch-through coupling.

FIG. 5 shows a circuit diagram of an FCI hybrid diode as an advantageous application of the FCI-PT diode according to FIGS. 2 and 4. A parallel circuit formed by a diode D$_2$ and a diode D$_{FCI}$ is situated between an anode terminal A and a cathode terminal K. In this case, for example, the diode D$_2$ is a power diode optimized for good forward behavior. The FCI diode D$_{FCI}$ has the function of a voltage limiter and is active only in the reverse mode. In the forward mode, the diode D$_{FCI}$ is blocked by a diode D$_1$ which is connected in series and reverse-connected in parallel therewith. Consequently, the diode D$_2$ is relevant in the forward mode and the diode D$_{FCI}$ is relevant in the reverse mode.

The diodes D$_1$, D$_2$ and D$_{FCI}$ can be realized as a monolithically integrated semiconductor component. However, a discrete realization of the components is also conceivable. The advantages of a monolithically integrated configuration reside in a low-inductance structure which, in particular, permits the switching losses to be reduced.

The application of FCI-PT diodes as freewheeling diodes or voltage limiters in a parallel circuit with turn-off power semiconductor components, such as bipolar transistors, MOSFETs, IGBTs, GTOs, thyristors, MCTs, etc., for example, is particularly advantageous. In this case, not only monolithic integration but also a hybrid or discrete structure is conceivable.

Finally, a particular advantage of the invention is that the FCI diodes according to the invention can also be constructed as simple diodes with a Read structure. This has not been possible to date since the breakdown voltage of Read diodes of this type is extremely dependent on temperature. The cause of the great temperature dependence of the breakdown voltage lies in the temperature dependence of the impact ionization which occurs within the high-field zone in the voltage breakdown and, due to the constant space charge of this high-field zone, it has a particularly severe effect on the field strength of the adjoining, distinctly wider low-field zone and, consequently, on the breakdown voltage of the diode. In order to circumvent this problem of space charge coupling, extremely complicated structures have been proposed to date in which the field strengths of the high-field zones and low-field zones have been coupled not through the use of a constant space charge, but by utilizing the "punch-through" effect or through the use of geometry effects as described above.

According to the invention, FCI diodes having a Read structure can be realized by way of the doping concentration in the n$_+$-doped cathode zone 3. It is thus possible, by way of the level of the doping concentration of the cathode zone 3, in a manner similar to that done in low-power diodes, to promote the tunnel effect at the pn junction between the p-doped anode zone 6 and the n-doped cathode zone 3.

Since the tunnel effect has a temperature coefficient opposite to that of impact ionization, the temperature coefficient of the breakdown voltage of the FCI diode constructed as a Read diode can be set virtually as desired by way of the level of the doping concentration in the cathode zone 3. It can thus be expected that, for example given a doping concentration of the cathode zone 3 of about $10_{17}$ cm$_{-3}$, a breakdown voltage of the FCI diode constructed as a Read diode with a weakly positive temperature coefficient can be established. As a result, it is possible to avoid current splitting and ensure reliable operation. However, a prerequisite therefor is an anode zone 6 which is doped distinctly more highly than the cathode zone 3.

The invention thus enables, in a technologically very simple manner, an FCI diode to be constructed in the very simple structure of a Read diode. In this case the temperature dependence of the breakdown voltage can be set as desired and, accordingly, can also be compensated for.

We claim:

1. A power diode, comprising a semiconductor body having:
   an inner zone of a first conduction type;
   a cathode zone of the first conduction type adjoining said inner zone and having a higher doping concentration than said inner zone;
   at least one first coupling zone of the first conduction type having a doping concentration higher than said inner zone and lower than said cathode zone;
   an anode zone of a second conduction type adjoining said first coupling zone and having a higher doping concentration than in said first coupling zone; and
   at least one second coupling zone of the second conduction type disposed between said first coupling zone and said inner zone, said at least one second coupling zone having a doping concentration higher than said inner zone and lower than said anode zone.

2. A diode assembly, comprising a semiconductor body including:
  a power diode having an inner zone of a first conduction type, a cathode zone of the first conduction type adjoining said inner zone and having a higher doping concentration than said inner zone, at least one first coupling zone of the first conduction type having a doping concentration higher than said inner zone and lower than said cathode zone, an anode zone of a second conduction type adjoining said first coupling zone and having a higher doping concentration than in said first coupling zone, and at least one second coupling zone of the second conduction type disposed between said first coupling zone and said inner zone, said at least one second coupling zone having a doping concentration higher than said inner zone and lower than said anode zone; and
  at least one monolithically integrated diode connected in series and reverse-connected in parallel with said power diode.

3. A hybrid diode configuration, comprising a power diode including a semiconductor body having:
  an inner zone of a first conduction type;
  a cathode zone of the first conduction type adjoining said inner zone and having a higher doping concentration than said inner zone;
  at least one first coupling zone of the first conduction type having a doping concentration higher than said inner zone and lower than said cathode zone;
  an anode zone of a second conduction type adjoining said first coupling zone and having a higher doping concentration than in said first coupling zone; and
  at least one second coupling zone of the second conduction type disposed between said first coupling zone and said inner zone, said at least one second coupling zone having a doping concentration higher than said inner zone and lower than said anode zone.

4. A voltage limiter, comprising a power diode including a semiconductor body having:
  an inner zone of a first conduction type;
  a cathode zone of the first conduction type adjoining said inner zone and having a higher doping concentration than said inner zone;
  at least one first coupling zone of the first conduction type having a doping concentration higher than said inner zone and lower than said cathode zone;
  an anode zone of a second conduction type adjoining said first coupling zone and having a higher doping concentration than in said first coupling zone; and
  at least one second coupling zone of the second conduction type disposed between said first coupling zone and said inner zone, said at least one second coupling zone having a doping concentration higher than said inner zone and lower than said anode zone.

5. A freewheeling diode, comprising a power diode including a semiconductor body having:
  an inner zone of a first conduction type;
  a cathode zone of the first conduction type adjoining said inner zone and having a higher doping concentration than said inner zone;
  at least one first coupling zone of the first conduction type having a doping concentration higher than said inner zone and lower than said cathode zone;
  an anode zone of a second conduction type adjoining said first coupling zone and having a higher doping concentration than in said first coupling zone; and
  at least one second coupling zone of the second conduction type disposed between said first coupling zone and said inner zone, said at least one second coupling zone having a doping concentration higher than said inner zone and lower than said anode zone.

6. The power diode according to claim 1, including a Read diode structure.

7. A power diode assembly, comprising a semiconductor body including:
  a power diode having an inner zone of a first conduction type, a cathode zone of the first conduction type adjoining said inner zone and having a higher doping concentration than said inner zone, at least one first coupling zone of the first conduction type having a doping concentration higher than said inner zone and lower than said cathode zone, an anode zone of a second conduction type adjoining said first coupling zone and having a higher doping concentration than in said first coupling zone, and at least one second coupling zone of the second conduction type disposed between said first coupling zone and said inner zone, said at least one second coupling zone having a doping concentration higher than said inner zone and lower than said anode zone; and
  a power semiconductor component in a parallel circuit with said power diode.

* * * * *